(12) United States Patent
Lee

(10) Patent No.: US 10,186,324 B2
(45) Date of Patent: Jan. 22, 2019

(54) NONVOLATILE MEMORY DEVICE, MEMORY SYSTEM INCLUDING THEREOF AND OPERATING METHOD THEREOF

(71) Applicant: SK hynix Inc., Gyeonggi-do (KR)

(72) Inventor: Hyung Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/785,567

(22) Filed: Oct. 17, 2017

(65) Prior Publication Data

US 2018/0240528 A1  Aug. 23, 2018

(30) Foreign Application Priority Data

Feb. 23, 2017  (KR) .................. 10-2017-0023887

(51) Int. Cl.
*G11C 16/04* (2006.01)
*G11C 16/34* (2006.01)
*G11C 16/14* (2006.01)

(52) U.S. Cl.
CPC .......... *G11C 16/3445* (2013.01); *G11C 16/14* (2013.01)

(58) Field of Classification Search
CPC ........................... G11C 16/3445; G11C 16/14
See application file for complete search history.

(56) References Cited

U.S. PATENT DOCUMENTS

| | | | | |
|---|---|---|---|---|
| 6,571,312 B1 * | 5/2003 | Sugai | ..................... | G11C 16/16 365/185.29 |
| 7,379,331 B2 * | 5/2008 | Kasai | ..................... | G11C 29/52 365/185.09 |
| 9,390,001 B2 * | 7/2016 | Oh | ..................... | G06F 12/0246 |

FOREIGN PATENT DOCUMENTS

| | | |
|---|---|---|
| KR | 1020150044738 | 4/2015 |
| KR | 1020150122493 | 11/2015 |

* cited by examiner

*Primary Examiner* — Pho M Luu
(74) *Attorney, Agent, or Firm* — IP & T Group LLP

(57) ABSTRACT

A method for operating a memory system includes determining at least one erased memory cell among a plurality of erased memory cells as an unstable memory cell based on read data read from the at least one erased memory cell; determining the unstable memory cell as an unwritable memory cell based on write data to be written in the unstable memory cell; and prohibiting the plurality of erased memory cells from being used, depending on the number of erased memory cells as the unwritable memory cell among the plurality of erased memory cells.

20 Claims, 7 Drawing Sheets

Unwritable memory cell

NONVOLATILE MEMORY DEVICE, MEMORY SYSTEM INCLUDING THEREOF AND OPERATING METHOD THEREOF

CROSS-REFERENCES TO RELATED APPLICATION

The present application claims priority under 35 U.S.C. § 119(a) to Korean application number 10-2017-0023887, filed on Feb. 23, 2017, in the Korean Intellectual Property Office, which is incorporated herein by reference in its entirety.

BACKGROUND

1. Technical Field

Various embodiments generally relate to a semiconductor memory system, and, more particularly, to a memory system including a nonvolatile memory device, and an operating method thereof.

2. Related Art

Semiconductor technology memory systems, also referred to simply as memory systems, may store data provided by an external device in response to a write request. Memory systems may also provide stored data to an external device in response to a read request. The external device may be any electronic device. The external device may be a host electronic device to which the memory system is attached to or is embedded therein. Examples of external devices that use memory systems for storing data include computers such as desk top computers, lap top computers and tablets, digital cameras, cellular phones, smart phones, electronic organizers, electronic book readers, and the like. Memory systems may be embedded in an external device during manufacturing of the external devices or may be fabricated separately and then connected afterwards to an external device.

SUMMARY

The present invention provides a nonvolatile memory device, a memory system employing the same, and an operating method thereof, capable of reducing write operation fails, and, thus, ensuring a higher data reliability than existing devices. Furthermore, the utilization efficiency of the various memory regions of the memory device may be improved.

In an embodiment, a method for operating a memory system may include: determining at least one erased memory cell among a plurality of erased memory cells as an unstable memory cell based on read data read from the at least one erased memory cell; determining the unstable memory cell as an unwritable memory cell based on write data to be written in the unstable memory cell; and prohibiting the plurality of erased memory cells from being used, depending on the number of erased memory cells as the unwritable memory cell among the plurality of erased memory cells.

In an embodiment, a method for operating a memory system may include: comparing read data read from an erased memory cell with a first value; comparing write data to be written in the erased memory cell with a second value; and determining the erased memory cell as an unwritable memory cell depending on comparison results.

In an embodiment, a method for operating a memory system may include: determining at least one erased memory cell among the plurality of erased memory cells as an unstable memory cell depending on whether the at least one erased memory cell has a threshold voltage higher than a reference voltage; and determining the unstable memory cell as an unwritable memory cell depending on whether write data to be written in the unstable memory cell corresponds to a lowest threshold voltage distribution among a plurality of threshold voltage distributions.

In an embodiment, a memory system may include: a nonvolatile memory device including a plurality of erased memory cells; and a controller suitable for determining at least one erased memory cell among the plurality of erased memory cells as an unstable memory cell based on read data read from the at least one erased memory cell, determining the unstable memory cell as an unwritable memory cell based on write data to be written in the unstable memory cell, and prohibiting the plurality of erased memory cells from being used, depending on the number of erased memory cells as the unwritable memory cell among the plurality of erased memory cells.

In an embodiment, a memory system may include: a nonvolatile memory device including a plurality of erased memory cells; and a controller suitable for comparing read data read from at least one erased memory cell among the plurality of erased memory cells with a first value, comparing write data to be written in the at least one erased memory cell with a second value, and determining the at least one erased memory cell as an unwritable memory cell depending on comparison results.

In an embodiment, a memory system may include: a nonvolatile memory device including a plurality of erased memory cells; and a controller suitable for determining at least one erased memory cell among the plurality of erased memory cells as an unstable memory cell depending on whether the at least one erased memory cell has a threshold voltage higher than a reference voltage, and determining the unstable memory cell as an unwritable memory cell depending on whether write data to be written in the unstable memory cell corresponds to a lowest threshold voltage distribution among a plurality of threshold voltage distributions.

In an embodiment, a nonvolatile memory device may include: a plurality of erased memory devices; and a write determination unit configured to determine at least one erased memory cell among the plurality of erased memory cells as an unstable memory cell based on read data read from the at least one erased memory cell, determine the unstable memory cell as an unwritable memory cell based on write data to be written in the unstable memory cell, and determine whether to prohibit a plurality of erased memory cells from being used, depending on the number of erased memory cells as the unwritable memory cells among the plurality of erased memory cells.

In an embodiment, a nonvolatile memory device may include: a plurality of erased memory devices; and a write determination unit, wherein the write determination unit compares read data read from an erased memory cell with a first value, compares write data to be written in the erased memory cell with a second value, and determines the erased memory cell as an unwritable memory cell depending on comparison results.

In an embodiment, a nonvolatile memory device may include: a plurality of erased memory devices; and a write determination unit configured to determine at least one erased memory cell among the plurality of erased memory cells as an unstable memory cell depending on whether the at least one erased memory cell has a threshold voltage higher than a reference voltage, and determine the unstable memory cell as an unwritable memory cell depending on whether write data to be written in the unstable memory cell corresponds to a lowest threshold voltage distribution among a plurality of threshold voltage distributions.

BRIEF DESCRIPTION OF THE DRAWINGS

The above and other features and advantages of the present invention will become more apparent to those skilled in the art to which the present invention belongs by describing various embodiments thereof with reference to the attached drawings in which.

DETAILED DESCRIPTION

Figure 1:
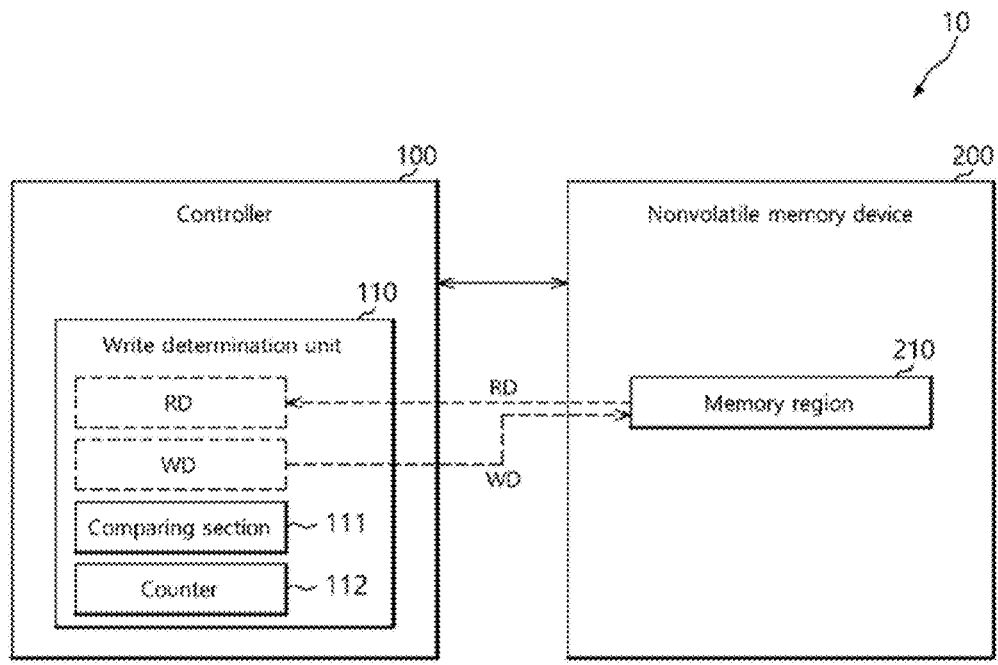
FIG. 1 is a block diagram Illustrating a memory system in accordance with an embodiment of the present invention.

Hereinafter, various exemplary embodiments of the present invention including a memory system and an operating method thereof are described with reference to the accompanying drawings. It is noted, however, that the present invention may be embodied in different other forms and should not be construed as being limited only to the embodiments set forth herein. Rather, these embodiments are provided to describe the present invention in sufficient detail so that a person skilled in the art to which the present invention pertains can practice the technical concepts of the present invention without undue experimentation.

It is to be understood that embodiments of the present invention are not limited to the particulars shown in the drawings, that the drawings are not necessarily drawn to scale, and, in some instances, various proportions of the drawings may have been exaggerated for more clearly depicting certain features or elements of the invention. Furthermore, while particular terminology is used, it is to be appreciated that the terminology used is for describing particular embodiments only and is not intended to limit the scope of the present invention.

It will be further understood that when a feature or element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other non-stated elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a memory system 10 in accordance with an embodiment of the present invention.

The memory system 10 may be employed as a data storage device for storing data for any suitable electronic device. The memory system 10 may be configured to store data provided from an external device which is operatively coupled with the memory system 10, in response to a write request received from the external device. Also, the memory system 10 may be configured to provide stored data to the external device, in response to a read request received from the external device.

For example, the memory system 10 may be operatively coupled to, or configured as a Personal Computer Memory Card International Association (PCMCIA) card, a Compact Flash (CF) card, a smart media card, a memory stick, various multimedia cards (e.g., MMC, eMMC, RS-MMC, and MMC-Micro), various secure digital cards (e.g., SD, Mini-SD, and Micro-SD), a Universal Flash Storage (UFS), a Solid-State Drive (SSD) and the like.

The memory system 10 may include a controller 100 and a nonvolatile memory device 200 operatively coupled to each other via one or more channels The controller 100 may control the operation of the memory system 10, such as for example, foreground and and/or background operations of the memory system. The foreground and background operations may also be referred to herein as the general operations. Foreground operations may include, for example, read and write operations, while background operations may Include refresh, wear leveling, map update, garbage collection operations. In an embodiment, the controller 100 may control all of the general operations of the memory system 10, however, the present invention is not limited in this way. For example, the controller 100 may perform a write operation for the nonvolatile memory device 200 in response to a write request received from the external device. Also, the controller 100 may perform a read operation for the nonvolatile memory device 200 in response to a read request received from the external device. It is noted, that although in the described embodiment of FIG. 1, the memory system is Illustrated as comprising only one controller, the present invention is not limited in this way and one or more controllers 100 may be used.

The controller 100 may include a write determination unit 110. The write determination unit 110 may determine, before writing write data WD in a plurality of erased memory cells included in a memory region 210 of the nonvolatile memory device 200, whether to write the write data WD in the corresponding erased memory cells, based on read data RD read from the corresponding erased memory cells.

In detail, first, the write determination unit 110 may determine whether or not an erased memory cell is an unstable memory cell based on the read data RD read out from the erased memory cell. The write determination unit 110 may make this determination for each of the erased cells of the memory region 210 of the nonvolatile memory device 200. For example, the write determination unit 110 may determine an erased memory cell to be an unstable memory cell when, based on the read data RD read from the memory cell, it is determined that the erased memory cell has a threshold voltage that is higher or greater than a reference voltage. A method for determining an unstable memory cell will be described in detail with reference to FIG. 4.

If an erased memory cell is determined to be an unstable memory cell, then the write determination unit 110 may determine whether or not the unstable memory cell is an unwritable memory cell based on write data WD to be written in the unstable memory cell. For example, the write determination unit 110 may determine the unstable memory cell as an unwritable memory cell when it is determined that the write data WD to be written in the unstable memory cell corresponds to the lowest threshold voltage distribution among a plurality of threshold voltage distributions of the memory cells. A method for determining whether or not an unstable memory cell is an unwritable memory cell will be described in detail with reference to FIG. 5.

The write determination unit 110 may prohibit use of the erased memory cells depending on the number of unwritable memory cells among the erased memory cells of the memory region 210. For example, when the number of unwritable memory cells does not exceed a threshold number, the write determination unit 110 may control the nonvolatile memory device 200 to write the write data WD In the erased memory cells of the memory region 210. In contrast, when the number of unwritable memory cells exceeds the threshold number, the write determination unit 110 may prohibit use of the erased memory cells of the memory region 210. The erased memory cells may be coupled to a common word line. In other words, the memory region may be defined as all memory cells coupled to a common word line and the write determination unit 110 may prohibit use of the memory cells which are to be accessed simultaneously through the common word line to perform a write operation, when the number of unwritable cells exceeds the threshold number. If it is determined not to write the write data WD in the erased memory cells of the memory region 210, the write determination unit 110 may write the write data WD in other erased memory cells of a different memory region. The write determination unit 110 may determine whether to write the write data WD, for the other erased memory cells of a different memory region, according to the above-described method.

According to the above-described method, for each of erased memory cells, the write determination unit 110 may determine whether a corresponding erased memory cell satisfies a condition in which the corresponding erased memory cell becomes an unstable memory cell, and then, determine in a stepwise manner whether an unstable memory cell satisfies a condition in which the corresponding unstable memory cell becomes an unwritable memory cell. In a variation of this embodiment, for each of the erased memory cells, the write determination unit 110 may determine simultaneously whether a corresponding erased memory cell satisfies both a condition in which the corresponding erased memory cell becomes an unstable memory cell and a condition in which the corresponding erased memory cell becomes an unwritable memory cell.

The write determination unit 110 may include a comparing section 111 and a counter 112.

The comparing section 111 may compare read data RD with a first value to determine whether an erased memory cell is an unstable memory cell. The first value may be data which is read when the reference voltage is applied to an erased memory cell having a threshold voltage higher than the reference voltage. The reference voltage may be equal to or lower (or less) than a read voltage having a lowest level among one or more read voltages to be used to read data stored in a memory cell. Therefore, when the read data RD is the same as the first value, the comparing section 111 may determine an erased memory cell as an unstable memory cell.

Also, the comparing section 111 may compare write data WD with a second value to determine whether an unstable memory cell is an unwritable memory cell. The second value may be data which is written in a memory cell positioned in the lowest threshold voltage distribution among a plurality of threshold voltage distributions of memory cells for which a write operation is performed. Therefore, when the write data RD is the same as the second value, the comparing section 111 may determine an unstable memory cell to be an unwritable memory cell.

The counter 112 may count the number of unwritable memory cells among erased memory cells of a memory region 210.

The nonvolatile memory device 200 may store data received from the controller 100 and may read stored data and transmit the read data to the controller 100, according to control of the controller 100. The nonvolatile memory device 200 may include the memory region 210 for storing data. The memory region 210 may include a plurality of memory cells capable of being accessed through a common word line. The nonvolatile memory device 200 may write simultaneously data in the plurality of memory cells of the memory region 210 and read simultaneously data from the plurality of memory cells, through the word line. Hence, the memory region 210 may be as described above a page, i.e., a plurality of memory cells coupled to the same word line. The nonvolatile memory device may include a plurality of memory regions 210 organized as a memory block. A plurality of memory blocks may define a plane. One or more planes may be included in the nonvolatile memory device 200. This architecture is well known and will not be described in any further detail. However, it is noted that the invention is not limited in only such memory architecture and that many other architectures may be employed without departing from the scope of the present invention.

Any suitable nonvolatile memory device 200 may be employed, including a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

While it is illustrated in FIG. 1 that the memory system 10 includes one nonvolatile memory device 200, it is to be noted that the number of nonvolatile memory devices included in the memory system 10 is not limited thereto and may vary according to design.

Figure 2:
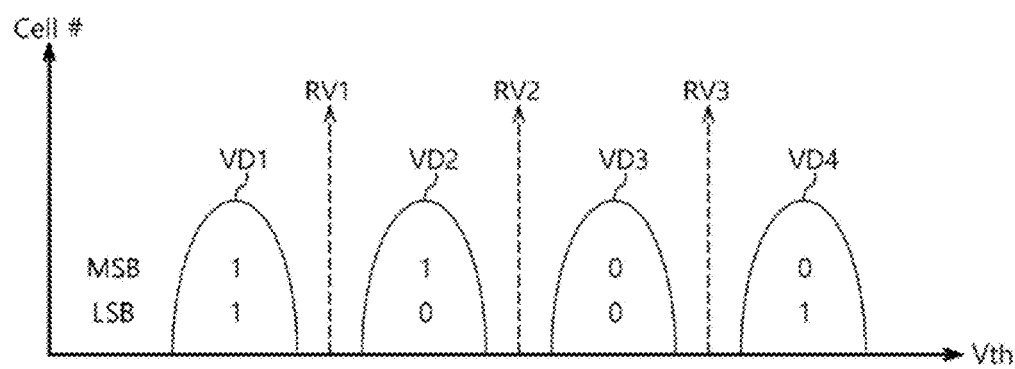
FIG. 2 is a diagram illustrating threshold voltage distributions of memory cells.

FIG. 2 is a diagram illustrating threshold voltage distributions VD1 to VD4 of memory cells. In FIG. 2 and the following FIGS. 3 to 5, the horizontal axis Vth represents a threshold voltage of a memory cell, and the vertical axis Cell # represents the number of memory cells corresponding to a threshold voltage. Because of small differences between the memory cells of a memory device any given state of the memory cells includes a distribution of voltages rather than a single voltage.

Referring to FIG. 2, when 2-bit data is stored in each memory cell, a memory cell may be programmed to any one of the threshold voltage distributions VD1 to VD4 depending on the data stored therein. When a write operation is performed, a memory cell may be controlled to be positioned in any one of the four threshold voltage distributions VD1 to VD4 depending on 2-bit data to be written. For example, a memory cell written with data "11" may have a threshold voltage corresponding to the threshold voltage distribution VD1. A memory cell written with data "10" may have a threshold voltage corresponding to the threshold voltage distribution VD2. A memory cell written with data "00" may have a threshold voltage corresponding to the threshold voltage distribution VD3. A memory cell written with data "01" may have a threshold voltage corresponding to the threshold voltage distribution VD4. The present invention is not limited to memory cells capable of storing only two bits of data. The memory cells may store one, two, three, four, five or more bits based on design. Generally, when k number of bits are stored in each memory cell, a memory cell may be positioned in any one among $2^k$ number of threshold voltage distributions depending on the data stored therein.

Also, memory cells coupled to a common word line may correspond to one or to two pages. For example, memory cells coupled to a common word line may correspond two pages, that is, a least significant bit (LSB) page and a most significant bit (MSB) page. A lower bit and an upper bit stored in each memory cell may be stored in the LSB page and the MSB page, respectively. That is to say, the LSB page is a region in which the lower bits of the memory cells coupled to the common word line are stored, and the MSB page is a region in which the upper bit of the memory cells coupled to the common word line are stored. When k number of bits are stored in each memory cell, the memory cells coupled to the common word line may correspond to k number of pages.

When describing a read operation for a memory cell, the memory cell may be turned on or off depending on a threshold voltage, when a predetermined read voltage is applied through a word line. In detail, a memory cell may be turned on when a read voltage higher than its threshold voltage is applied, and may be turned off when a read voltage lower than its threshold voltage is applied. In this case, by sensing the current formed when a memory cell is turned on or off, it is possible to determine whether the threshold voltage of the memory cell is higher or lower than a read voltage. Thus, in the nonvolatile memory device 200, by applying a predetermined read voltage to memory cells, for example, data "1" may be read from a memory cell which has a threshold voltage lower than the read voltage, and for example, data "0" may be read from a memory cell which has a threshold voltage higher than the read voltage.

As a result, the nonvolatile memory device 200 may read the data stored in memory cells by applying read voltages RV1 to RV3 positioned between the threshold voltage distributions VD1 to VD4 to the memory cells. For example, since a memory cell positioned in the threshold voltage distribution VD2 is turned off when the read voltage RV1 is applied and is turned on when the read voltage RV2 is applied, data "10" may be read based on these operations.

Figure 3:
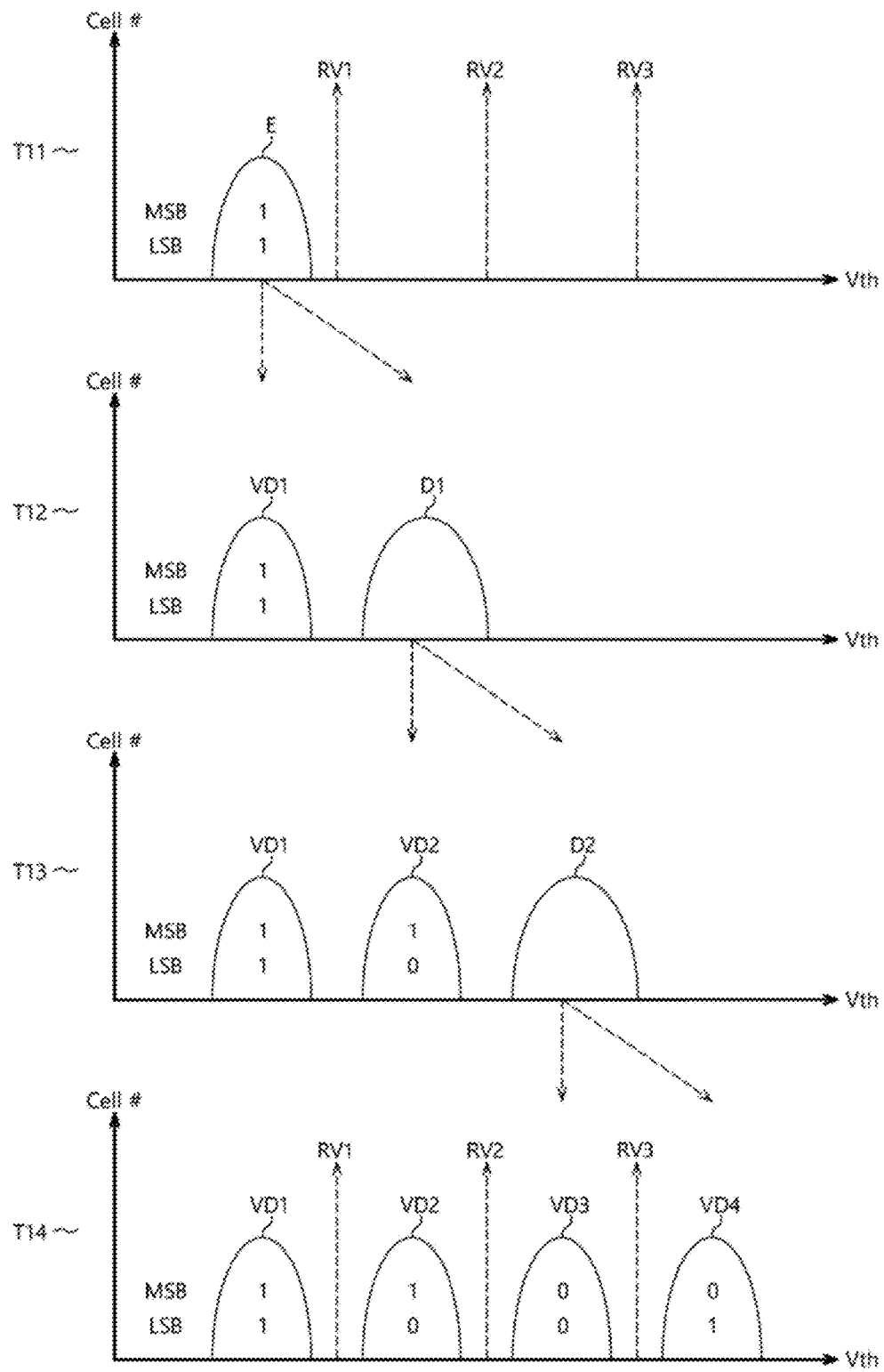
FIG. 3 is a diagram illustrating a method for performing a write operation.

FIG. 3 is a diagram Illustrating a method for performing a write operation. As described above, a write operation may be performed simultaneously for a plurality of memory cells coupled to a common word line, and the threshold voltage distributions VD1 to VD4 may be formed by the plurality of memory cells coupled to the common word line, as a result of performing the write operation. Also, the write operation may be performed in such a way as to store data simultaneously in the LSB page and the MSB page of the memory cells.

Referring to FIG. 3, at a time T11, memory cells may be in an erased state, and form a threshold voltage distribution E. It may be mentioned that the erased memory cells are stored with erase data "11." The erase data "11" may be data which is read when a read operation is performed by using any of the read voltages RV1, RV2 or RV3 for the erased memory cells.

At a time T12, some memory cells may have increased threshold voltages by being applied with a write voltage, and form a threshold voltage distribution D1. The remaining memory cells may be retained in the erased state, and form a threshold voltage distribution VD1.

At a time T13, some of the memory cells which form the threshold voltage distribution D1 may have their threshold voltages further increased by being subjected to a higher write voltage, and may thus form a threshold voltage distribution D2. The remaining memory cells of the memory cells which formed the threshold voltage distribution D1 may now form a threshold voltage distribution VD2.

At a time T14, some of the memory cells which form the threshold voltage distribution D2 may have their threshold voltages further increased by being subjected to a higher write voltage, and form a threshold voltage distribution VD4. The remaining memory cells of the memory cells which formed the threshold voltage distribution D2 may now form a threshold voltage distribution VD3.

Namely, while the write operation is performed, the memory cells which are in the erased state undergo increases in threshold voltages depending on data to be written. In this regard, memory cells to be written with the same data as the erase data "11," that is, memory cells to be positioned in the threshold voltage distribution VD1, are not subjected to an increase of their threshold voltages and are thus maintained in the erased state.

Figure 4:
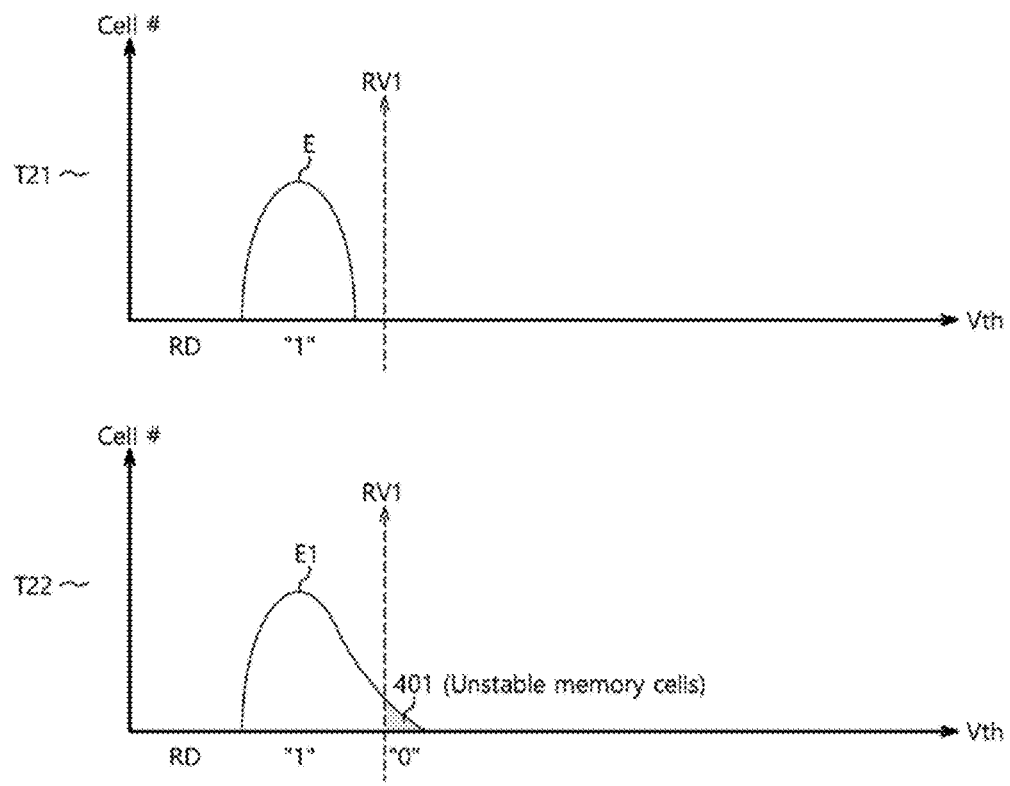
FIG. 4 is a diagram illustrating a case where erased memory cells coupled to a common word line are placed under an unstable state.

FIG. 4 is a diagram illustrating a case where erased memory cells coupled to a common word line are placed under an unstable state. Respective threshold voltage distributions E and E1 represent threshold voltage distributions which are formed by the plurality of memory cells coupled to the common word line.

Referring to FIG. 4, at a time T21, erased memory cells may be in a stable state when they form the threshold voltage distribution E having a level lower than the read voltage RV1. At this time, if a read operation is performed by using the read voltage RV1, all the erased memory cells may be turned on since they have threshold voltages lower than the read voltage RV1, and read data RD of "1" may be read.

At a time T22, some memory cells 401 among the erased memory cells may be placed under an unstable state due to various reasons, and the erased memory cells may form the threshold voltage distribution E1. The erased memory cells which are placed under the unstable state, that is, the unstable memory cells 401 may have threshold voltages higher than the read voltage RV1. For example, the unstable memory cells 401 may be placed under the unstable state by an incomplete erase operation. Another example of an event that may cause the E1 voltage distribution, may include a sudden power-off causing unstable memory cells 401 to be placed under the unstable state by the influence of sudden power-off disturbance. If a read operation is performed by using the read voltage RV1, the unstable memory cells 401 may be turned off since they have threshold voltages higher than the read voltage RV1, and, hence, output read data RD of "0."

The unstable memory cells 401 which have threshold voltages already increased to a level that is higher than the read voltage RV1 cannot be positioned in the threshold voltage distribution VD1 through a write operation. This is because, as described above with reference to FIG. 3, a write operation is performed by increasing in a step wise manner the threshold voltages of memory cells. Therefore, the unstable memory cells 401 are inappropriate to store write data WD corresponding to the erase data of "11." However, even the unstable memory cells 401 may be used in storing write data WD not corresponding to the erase data of "11."

Thus, according to an embodiment of the present embodiment, the write determination unit 110 may determine unstable memory cells 401 among erased memory cells by referring to the read data RD read from the erased memory cells, and may determine unwritable memory cells among the unstable memory cells 401 by referring to write data WD to be written in the unstable memory cells 401. The unwritable memory cells may be memory cells which are to be written with write data WD corresponding to the erase data of "11" among the unstable memory cells 401, as described above. When the number of unwritable memory cells exceeds the threshold number, the write determination unit 110 may prohibit use of the memory cells which are coupled to the common word line. In some embodiments, whether the respective unstable memory cells 401 are unwritable or not may be determined differently depending on what data are to be written. In some embodiments, whether to prohibit use of the memory cells coupled to the common word line may be determined differently depending on what data are to be written.

In some embodiments, the threshold number may be the number of unwritable memory cells which may be allowed to be present among the memory cells coupled to the common word line. Since unwritable memory cells do not store data appropriately and output error bits when a read operation is performed subsequently, according to an embodiment, the threshold number may be determined in consideration of the error correction capability of the memory system 10. Hence, because read data RD including error bits may be recovered to normal data through an error correction operation, unwritable memory cells may be allowed up to a number that equals the number of correctable errors. Stated otherwise, the threshold number may be selected according to the number of correctable errors.

Figure 5:
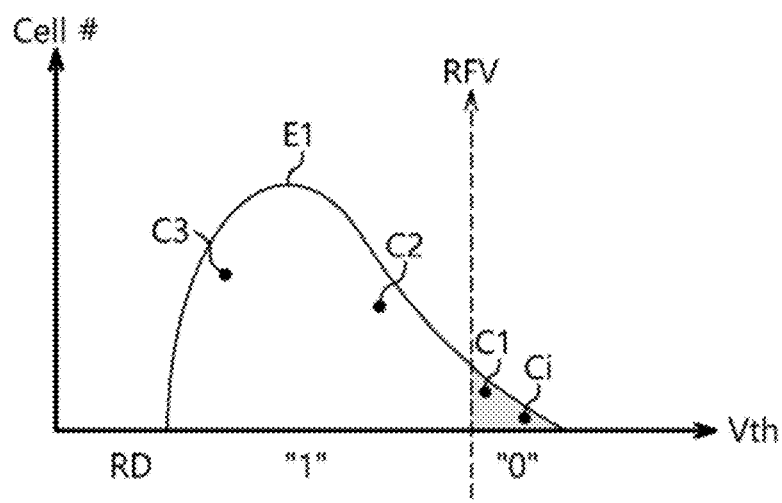
FIG. 5 is a diagram illustrating a method for determining an unwritable memory cell.
Figure 5:
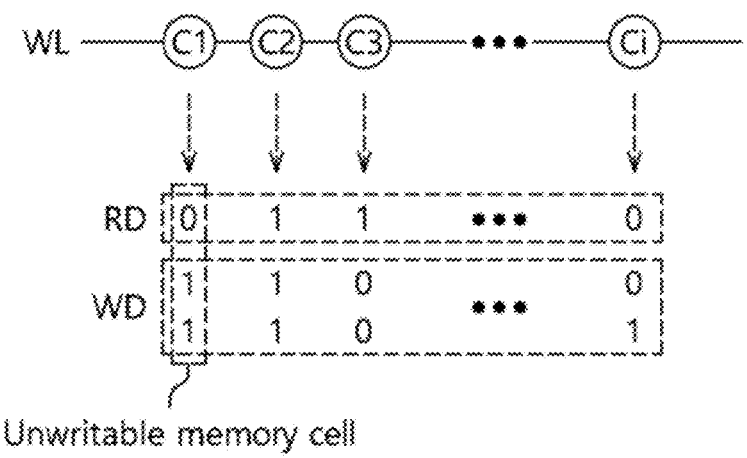

FIG. 5 is a diagram illustrating a method for determining an unwritable memory cell. For example, FIG. 5 illustrates a method for determining an unwritable memory cell C1 among a plurality of erased memory cells C1 to Ci coupled to a word line WL.

Referring to FIG. 5, before writing write data WD in the plurality of memory cells C1 to Ci, the write determination unit 110 shown in FIG. 1 may obtain read data RD from the memory cells C1 to Ci by performing a read operation. The read operation may be performed by using a reference voltage RFV. For instance, the memory cells C2 and C3 which have threshold voltages lower than the reference voltage RFV may output read data RD of "1," while the memory cells C1 and Ci which have threshold voltages higher than the reference voltage RFV may output read data RD of "0." The write determination unit 110 may determine the memory cells C2 and C3 of which read data RD is "1," as stable memory cells, while determine the memory cells C1 and Ci of which read data RD is "0," as unstable memory cells.

Meanwhile, the reference voltage RFV may be the read voltage RV1 shown in FIGS. 2 to 4. Alternatively, in order to determine an unstable memory cell based on a strict reference, the reference voltage RFV may be a voltage which is lower than the read voltage RV1.

After obtaining read data RD from the memory cells C1 to Ci, the write determination unit 110 may determine whether write data WD to be written in the unstable memory cells C1 and C1 is "11." Therefore, the write determination unit 110 may determine the unstable memory cell C1 of which write data WD is "11," as an unwritable memory cell.

According to an embodiment, the write determination unit 110 may determine whether patterns constructed by the read data RD and the write data WD correspond to predetermined patterns, for each of the memory cells C1 to Ci. That is to say, the write determination unit 110 may determine simultaneously whether the read data RD is "0" and whether the write data WD is "11." As a consequence, the write determination unit 110 may determine that the patterns of the read data RD and the write data WD correspond to the predetermined patterns for the memory cell C1 among the memory cells C1 to Ci, and determine the memory cell C1 as an unwritable memory cell.

Meanwhile, the stable memory cells C2 and C3 which output the read data RD of "1" may be writable regardless of what the write data WD are. Further, since the unstable memory cell Ci which has outputted the read data RD of "0" will store write data WD of "01" corresponding to a threshold voltage higher than a current threshold voltage, the unstable memory cell Ci may be writable.

In this way, the write determination unit 110 may determine unwritable memory cells among the memory cells C1 to Ci, and count the number of the unwritable memory cells.

The write determination unit 110 may prohibit use of the memory cells C1 to Ci when a counted number exceeds the threshold number.

In FIG. 5, since 2 bits are to be written in each memory cell, whether write data WD is "11" or not is determined. However, if i number of bits are to be written in each memory cell, whether or not write data WD corresponds to i number of "1"s may be determined.

Summarizing these, in the present embodiment, by considering write data WD, a reference to determine whether or not to use memory cells may be defined clearly. In the case where whether to use memory cells is determined by only the number of unstable memory cells, it may be ambiguous to determine an allowable number, and a write operation may eventually fail depending on write data WD. However, since the present embodiment considers specifically whether or not specific write data WD may be written, it is possible to prevent originally a write operation from failing, and thus, high data reliability may be ensured. Furthermore, in the present embodiment, the utilization efficiency of the memory region 210 including a plurality of memory cells may be improved.

Figure 6:
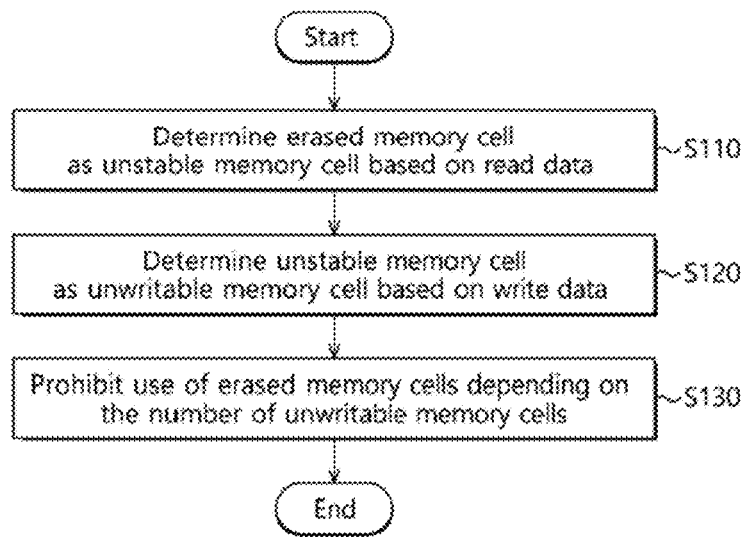
FIG. 6 is a flow chart Illustrating a method for operating a memory system in accordance with an embodiment of the present invention.

FIG. 6 is a flow chart illustrating a method for operating the memory system 10 in accordance with an embodiment of the present invention. For example, FIG. 6 illustrates a method for the write determination unit 110 of FIG. 1 to determine whether to write write data WD in the erased memory cells of the memory region 210.

Referring to FIG. 6, at step S110, for each of the erased memory cells, the write determination unit 110 may determine a corresponding erased memory cell as an unstable memory cell based on the read data RD read out from the corresponding erased memory cell. In detail, the write determination unit 110 may determine the erased memory cell as an unstable memory cell based on the read data RD when it is determined that the erased memory cell has a threshold voltage higher than the reference voltage. In some embodiments, the reference voltage may be equal to or lower than a read voltage having a lowest level among one or more read voltages to be used to read data stored in a memory cell.

At step S120, the write determination unit 110 may determine whether or not an unstable memory cell is an unwritable memory cell based on write data WD to be written in the unstable memory cell. In detail, the write determination unit 110 may determine that an unstable memory cell is an unwritable memory cell when it is determined that the write data WD to be written in the unstable memory cell corresponds to a lowest threshold voltage distribution among a plurality of threshold voltage distributions of the memory cells.

At step S130, the write determination unit 110 may prohibit use of the erased memory cells depending on the number of unwritable memory cells among the erased memory cells. For example, when the number of unwritable memory cells exceeds the threshold number, the write determination unit 110 may prohibit use of the erased memory cells. In some embodiments, the erased memory cells to be prohibited from being used may be memory cells which are coupled to a common word line.

Figure 7:
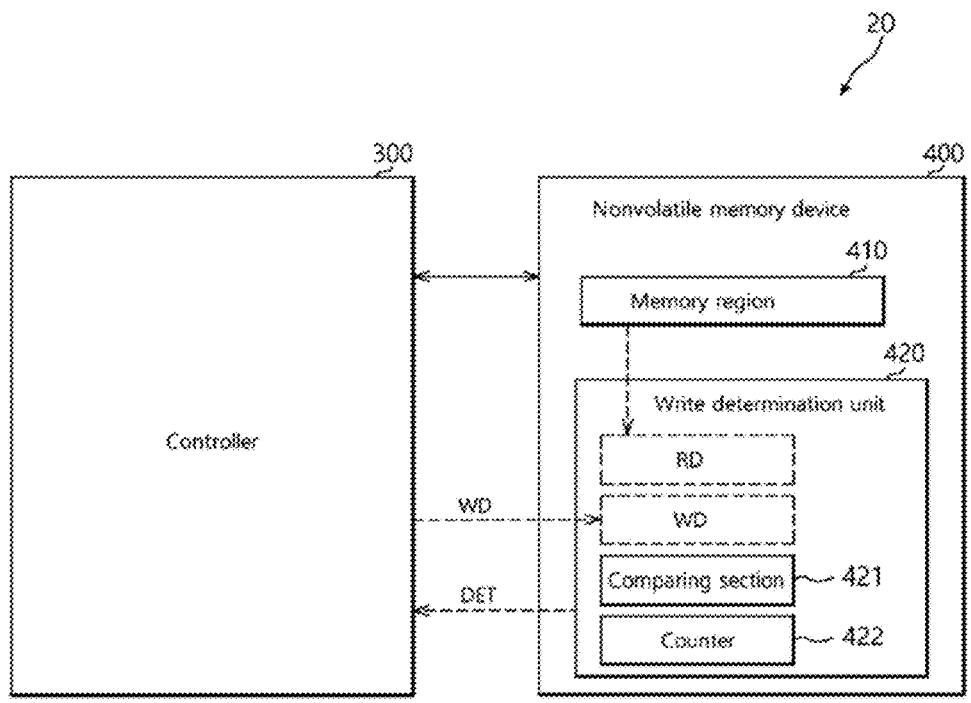
FIG. 7 is a block diagram illustrating a memory system in accordance with an embodiment of the present invention.

FIG. 7 is a block diagram Illustrating a memory system 20 in accordance with an embodiment of the present invention.

Referring to FIG. 7, the memory system 20 may include a controller 300 and a nonvolatile memory device 400. The nonvolatile memory device 400 may include a memory region 410 and the write determination unit 420. In the memory system 20 illustrated in FIG. 7, the write determination unit 420 may be included in the nonvolatile memory device 400 unlike the embodiment of FIG. 1 where the write determination unit 110 is included in the controller 100 in FIG. 1. The write determination unit 420 may include a comparing section 421 and a counter 422. The comparing section 421 and the counter 422 may operate in substantially the same manner as the comparing section 111 and the counter 112 of FIG. 1, respectively.

The write determination unit 420 may receive write data WD to be written in the erased memory cells of the memory region 410, from the controller 300. The write determination unit 420 may read data RD from the erased memory cells of the memory region 410 according to control of the controller 300. Employing the same method as in the write determination unit 110 of FIG. 1, the write determination unit 420 may count the number of unwritable memory cells among the erased memory cells based on the read data RD and the write data WD, and determine whether the erased memory cells are capable of being used, depending on a counted number. When the number of unwritable memory cells does not exceed the threshold number, that is, when it is determined that the erased memory cells are usable, the write determination unit 420 may write the write data WD in the erased memory cells. In contrast, when the number of unwritable memory cells exceeds the threshold number, that is, when it is determined that the erased memory cells should be prohibited from being used, the write determination unit 420 may report a determination result DET to the controller 300.

Based on the determination result DET from the write determination unit 420, the controller 300 may prohibit use of the erased memory cells, and control the write determination unit 420 to determine whether to use other erased memory cells.

Figure 8:
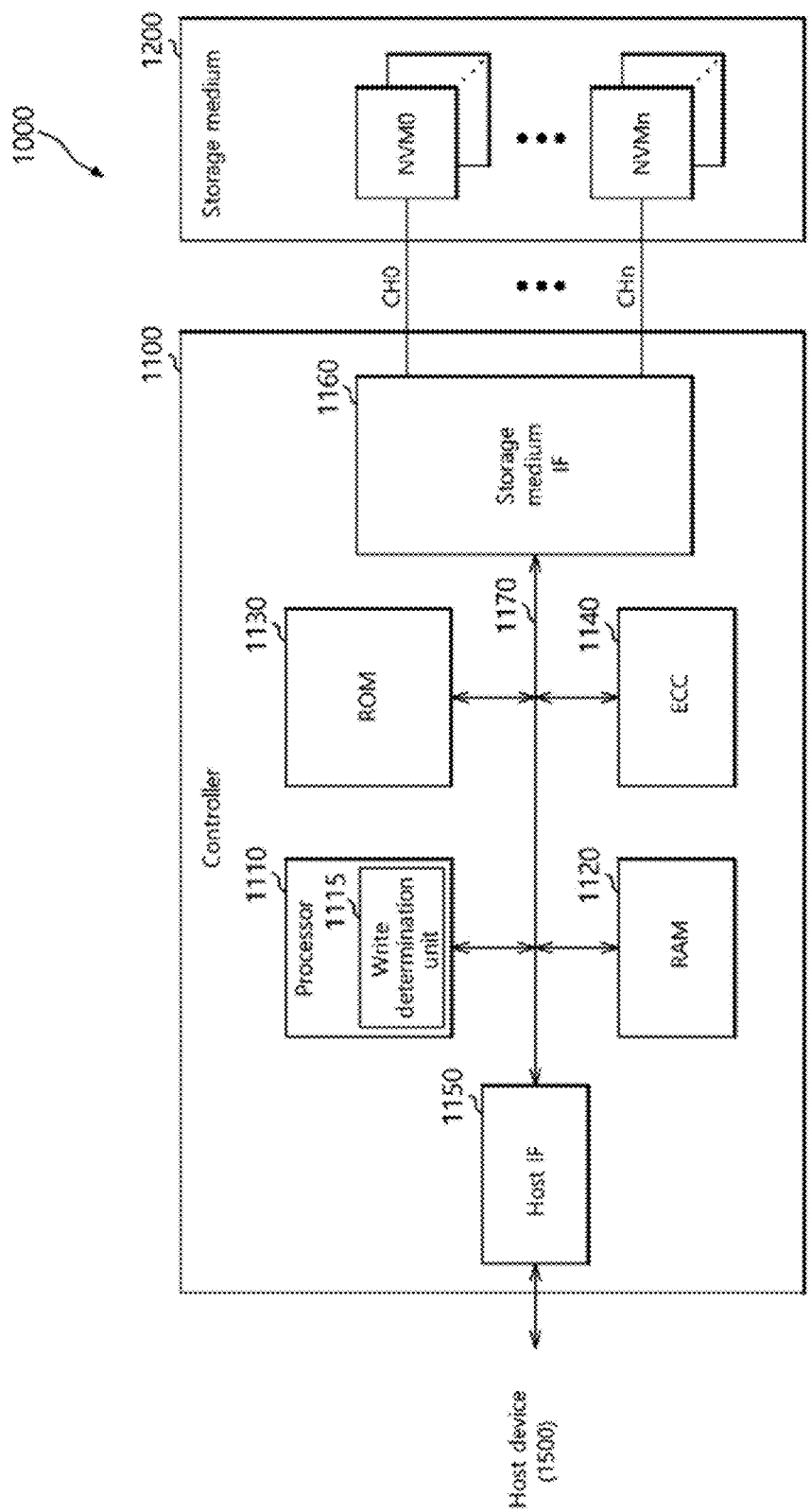
FIG. 8 is a block diagram illustrating a solid-state drive (SSD) in accordance with an embodiment of the present invention.

FIG. 8 is a block diagram Illustrating a solid-state drive (SSD) 1000 in accordance with an embodiment of the present invention.

Referring to FIG. 8, the SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface (IF) 1150 and a storage medium interface (IF) 1160 which are coupled through an internal bus 1170.

The processor 1110 may control the general operations of the controller 1100. The processor 1110 may store data in the storage medium 1200 and read stored data from the storage medium 1200, according to data processing requests received from the host device 1500. In order to efficiently manage the storage medium 1200, the processor 1110 may control background (also known as internal) operations of the SSD 1000 such as a merge operation, a wear leveling operation, and so forth.

The processor 1110 may include a write determination unit 1115. The write determination unit 1115 may be configured and operate in the same manner as the write determination unit 110 of FIG. 1. That is to say, for each of erased memory cells of a certain nonvolatile memory device, the write determination unit 1115 may determine an erased memory cell as an unstable memory cell based on the read data read out from the erased memory cell. Further, the write determination unit 1115 may determine an unstable memory cell as an unwritable memory cell based on write data to be written in the unstable memory cell. Moreover, the write determination unit 1115 may prohibit use of erased memory cells depending on the number of unwritable memory cells among the erased memory cells.

The RAM 1120 may store programs and program data to be used by the processor 1110. The RAM 1120 may temporarily store data received from the host interface 1150 before transferring it to the storage medium 1200, and may temporarily store read data from the storage medium 1200 before transferring it to the host device 1500.

The ROM 1130 may store program codes to be read by the processor 1110. The program codes may include commands to be processed by the processor 1110, for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to control of the controller 1100.

Meanwhile, according to an embodiment, the SSD 1000 may be configured and operate in the same manner as the memory system 20 of FIG. 7. In this case, each of the nonvolatile memory devices NVM0 to NVMn may include a write determination unit in the same manner as the nonvolatile memory device 400 of FIG. 7 includes the write determination unit 420.

Figure 9:
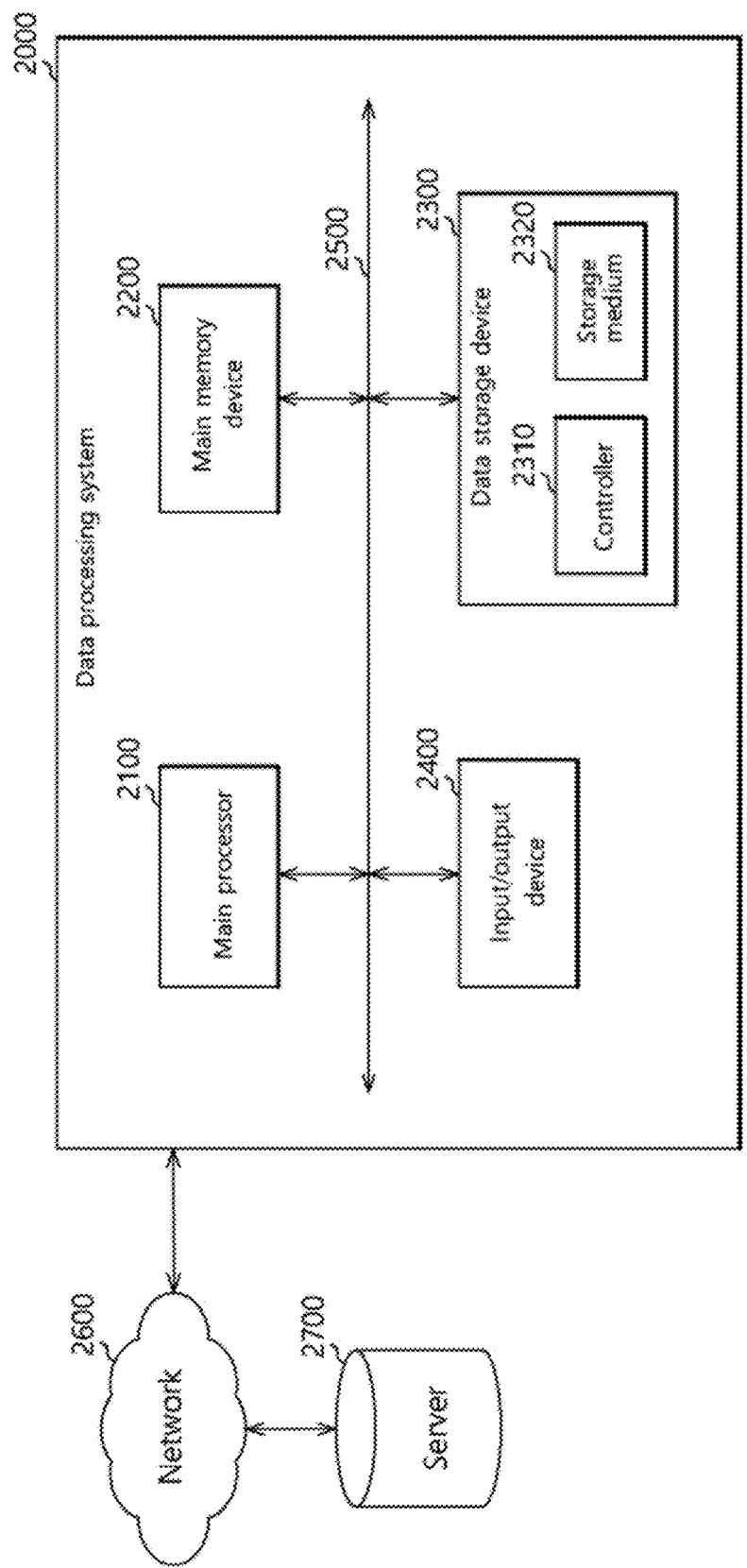
FIG. 9 is a block diagram illustrating a data processing system employing a memory system in accordance with an embodiment of the present invention.

FIG. 9 is a block diagram illustrating a data processing system 2000 employing a memory system like the memory systems 10 and 20 of FIGS. 1 and 7, respectively, in accordance with various embodiments.

Referring to FIG. 9, the data processing system 2000 may include a computer, a laptop, a netbook, a smart phone, a digital television (TV), a digital camera, a navigator, etc. The data processing system 2000 may include a main processor 2100, a main memory device 2200, a memory system 2300, and an input/output device 2400. The internal units of the data processing system 2000 may exchange data, control signals, etc. through a system bus 2500.

The main processor 2100 may control the general operations of the data processing system 2000. The main processor 2100 may be a central processing unit, for example, such as a microprocessor. The main processor 2100 may execute softwares such as an operation system, an application, a device driver, and so forth, on the main memory device 2200.

The main memory device 2200 may store programs and program data to be used by the main processor 2100. The main memory device 2200 may temporarily store data to be transmitted to the memory system 2300 and the input/output device 2400.

The memory system 2300 may include a controller 2310 and a storage medium 2320. The memory system 2300 may be configured and operate substantially similarly to the memory system 10 or 20 of FIG. 1 or 7.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are examples only. Accordingly, the memory system and the operating method thereof described herein should not be limited to the described embodiments. It will be apparent to those skilled in the art to which the present invention pertains that various other changes and modifications may be made without departing from the spirit and scope of the invention as defined in the following claims.

What is claimed is:

1. A method for operating a memory system, comprising:
   determining at least one erased memory cell among a plurality of erased memory cells as an unstable memory cell based on read data read from the at least one erased memory cell;
   determining the unstable memory cell as an unwritable memory cell based on write data to be written in the unstable memory cell; and
   prohibiting the plurality of erased memory cells from being used, depending on the number of erased memory cells as the unwritable memory cell among the plurality of erased memory cells.

2. The method according to claim 1, wherein the determining of the at least one erased memory cell as the unstable memory cell comprises:
   determining the at least one erased memory cell among the plurality of erased memory cells as the unstable memory cell based on the read data when it is determined that the at least one erased memory cell has a threshold voltage higher than a reference voltage.

3. The method according to claim 2, wherein the reference voltage is equal to or lower than a read voltage having a lowest level among one or more read voltages to be used to read data stored in a memory cell.

4. The method according to claim 1, wherein the determining of the unstable memory cell as the unwritable memory cell comprises:
   determining the unstable memory cell as the unwritable memory cell when it is determined that the write data corresponds to a lowest threshold voltage distribution among a plurality of threshold voltage distributions.

5. The method according to claim 1, wherein the plurality of erased memory cells are coupled to a common word line.

6. A method for operating a memory system, comprising:
   comparing read data read from an erased memory cell with a first value;
   comparing write data to be written in the erased memory cell with a second value; and
   determining the erased memory cell as an unwritable memory cell depending on comparison results.

7. The method according to claim 6, further comprising:
   reading the read data by applying a reference voltage to the erased memory cell, wherein the first value is data which is read when the reference voltage is applied to the erased memory cell having a threshold voltage higher than the reference voltage.

8. The method according to claim 7, wherein the reference voltage is equal to or lower than a read voltage having a lowest level among one or more read voltages to be used to read data stored in a memory cell.

9. The method according to claim 6, wherein the second value is data which is written in a memory cell of memory cells for which a write operation is performed, which is positioned in the lowest threshold voltage distribution among a plurality of threshold voltage distributions.

10. The method according to claim 6, further comprising:
prohibiting a plurality of erased memory cells from being used, depending on the number of erased memory cells as the unwritable memory cell among the plurality of erased memory cells.

11. The method according to claim 10, wherein the plurality of erased memory cells are coupled to a common word line.

12. A memory system comprising:
a nonvolatile memory device including a plurality of erased memory cells; and
a controller suitable for determining at least one erased memory cell among the plurality of erased memory cells as an unstable memory cell based on read data read from the at least one erased memory cell, determining the unstable memory cell as an unwritable memory cell based on write data to be written in the unstable memory cell, and prohibiting the plurality of erased memory cells from being used, depending on the number of erased memory cells as the unwritable memory cell among the plurality of erased memory cells.

13. The memory system according to claim 12, wherein the controller determines the at least one erased memory cell among the plurality of erased memory cells as the unstable memory cell based on the read data when it is determined that the at least one erased memory cell has a threshold voltage higher than a reference voltage.

14. The memory system according to claim 13, wherein the reference voltage is equal to or lower than a read voltage having a lowest level among one or more read voltages to be used to read data stored in a memory cell.

15. The memory system according to claim 12, wherein the controller determines the unstable memory cell as the unwritable memory cell when it is determined that the write data corresponds to a lowest threshold voltage distribution among a plurality of threshold voltage distributions.

16. The memory system according to claim 12, wherein the plurality of erased memory cells are coupled to a common word line.

17. A nonvolatile memory device comprising:
a plurality of erased memory devices; and
a write determination unit configured to:
determine at least one erased memory cell among the plurality of erased memory cells as an unstable memory cell depending on whether the at least one erased memory cell has a threshold voltage higher than a reference voltage; and
determine the unstable memory cell as an unwritable memory cell depending on whether write data to be written in the unstable memory cell corresponds to a lowest threshold voltage distribution among a plurality of threshold voltage distributions.

18. The nonvolatile memory device according to claim 17, wherein the write determination unit reads read data by applying the reference voltage to the at least one erased memory cell, and determines the at least one erased memory cell as the unstable memory cell depending on a result of comparing the read data with a first value.

19. The nonvolatile memory device according to claim 17, wherein the reference voltage is equal to or lower than a read voltage having a lowest level among one or more read voltages to be used to read data stored in a memory cell.

20. The nonvolatile memory device according to claim 17, wherein the write determination unit determines whether to prohibit the plurality of erased memory cells from being used, depending on the number of erased memory cells as the unwritable memory cell among the plurality of erased memory cells, and wherein the plurality of erased memory cells are coupled to a common word line.

* * * * *